United States Patent [19]

Bryant et al.

[11] Patent Number: 5,376,571
[45] Date of Patent: Dec. 27, 1994

[54] METHOD OF MAKING CONTACT ALIGNMENT FOR NONVOLATILE MEMORY DEVICES

[75] Inventors: Frank R. Bryant, Denton; Tsiu C. Chan, Carrollton, both of Tex.

[73] Assignee: SGS-Thomson Microelectronics, Inc., Carrollton, Tex.

[21] Appl. No.: 118,843

[22] Filed: Sep. 10, 1993

Related U.S. Application Data

[63] Continuation of Ser. No. 748,290, Aug. 21, 1991, abandoned.

[51] Int. Cl.⁵ .......................................... H01L 21/441
[52] U.S. Cl. .................................... 437/43; 437/193; 437/978; 437/979
[58] Field of Search .................... 437/43, 49, 52, 63, 437/64, 67, 193, 195, 978, 979, 984; 148/DIG. 43, DIG. 163

[56] References Cited

U.S. PATENT DOCUMENTS

| | | | |
|---|---|---|---|
| 4,935,380 | 6/1990 | Okumura | 437/43 |
| 5,013,674 | 5/1991 | Bergemont | 437/43 |
| 5,019,527 | 5/1991 | Ohshima et al. | 437/43 |
| 5,028,990 | 7/1991 | Kotaki et al. | 357/23.5 |
| 5,060,190 | 10/1991 | Chen et al. | 365/104 |
| 5,081,060 | 1/1992 | Kim | 437/52 |
| 5,113,238 | 5/1992 | Wang et al. | 357/54 |
| 5,231,043 | 7/1993 | Chan et al. | 437/52 |

FOREIGN PATENT DOCUMENTS

| | | |
|---|---|---|
| 0436475A2 | 7/1091 | European Pat. Off. . |
| 0369842A1 | 5/1990 | European Pat. Off. . |
| 0405850A2 | 1/1991 | European Pat. Off. . |
| 0471381A2 | 2/1992 | European Pat. Off. . |

OTHER PUBLICATIONS

Wolf et al., "Silicon processing for the VLSI Era", pp. 384–387, 1986.

*Primary Examiner*—Brian E. Hearn
*Assistant Examiner*—Chandra Chaudhari
*Attorney, Agent, or Firm*—Kenneth C. Hill; Lisa K. Jorgenson; Richard K. Robinson

[57] ABSTRACT

A layout and fabrication technique for EPROMs and similar devices includes a preferred technique for partially self-aligning bit line contacts. In addition, a self-aligned, buried Vss line is provided which is in contact with the substrate for its entire length. This provides a highly conductive Vss line, allowing the size of such line to be diminished. The use of a buried Vss contact line and a partially self-aligned bit line contact contributes to a device layout having minimum cell sizes for a given feature size.

6 Claims, 3 Drawing Sheets

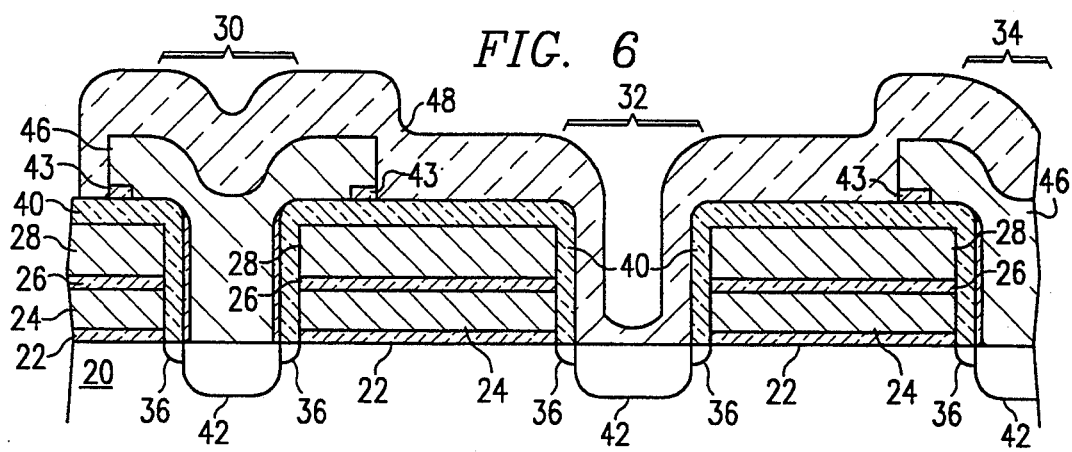
FIG. 6
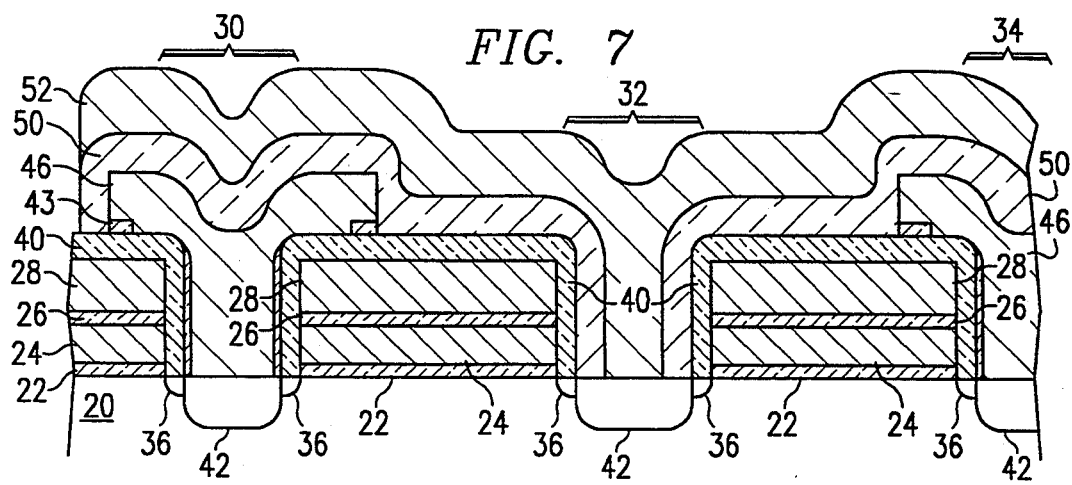
FIG. 7
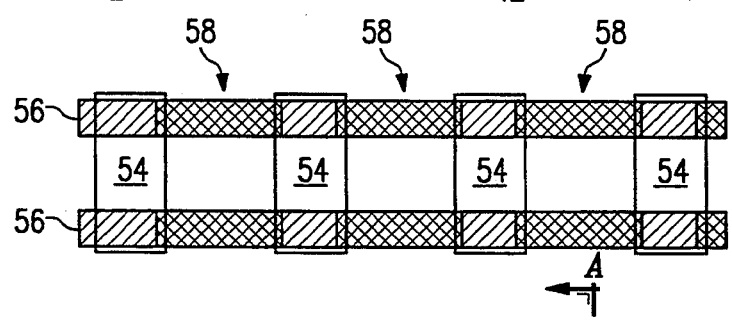
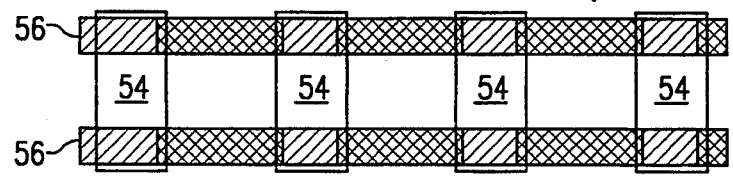
FIG. 8
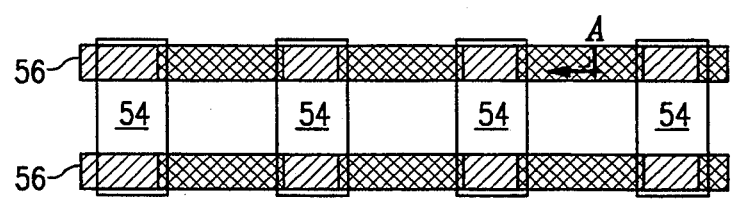

METHOD OF MAKING CONTACT ALIGNMENT FOR NONVOLATILE MEMORY DEVICES

This is a continuation of application Ser. No. 07/748,290 now abandoned, filed on Aug. 21, 1991.

CROSS REFERENCE TO RELATED APPLICATIONS

The present application contains subject matter in common with co-pending U.S. patent application Ser. No. 07/748,085, now U.S. Pat. No. 5,231,043, attorney docket number 90-C-64 filed concurrently herewith, titled CONTACT ALIGNMENT FOR INTEGRATED CIRCUITS, by Frank Randolph Bryant and Tsiu Chiu Chan, which is assigned to the assignee hereof and incorporated by reference hereinto.

BACKGROUND OF THE INVENTION

1. Field of the Invention

The present invention relates generally to integrated circuit devices; and more specifically to a technique for aligning contact openings in erasable/programmable read only memory devices.

2. Description of the Prior Art

As feature sizes and device sizes shrink for integrated circuits, relative alignment between interconnect layers becomes of critical importance. Misalignment can severely impact the functionality of a device. Misalignment beyond certain minimum tolerances can render a device partly or wholly non-operative.

To insure that contacts between interconnect layers are made properly even if a slight misalignment occurs during masking steps, extra space is usually included in a design around contacts and other conductive features. This extra retained space is known as enclosure. Enclosure sizes of up to a few tenths of a micron are typical for 0.5 to 1.0 micron feature sizes.

Enclosure requirements are not consistent with the continued shrinkage of devices. Enclosure is not related to device functionality, but is used only to ensure that misalignment errors don't cause problems with the device. When designing devices having minimum feature and device sizes, minimizing enclosure requirements can significantly impact the overall device size.

Self-alignment techniques are generally known in the art, and it is known that their use helps minimize enclosure requirements. However, the use of self-alignment techniques has been somewhat limited by device designs in current use. It would be desirable to provide a technique for fabricating integrated circuit devices which increases the number of self-aligned fabrication steps, thereby reducing enclosure requirements for the device.

High density EPROMs have regular layouts which allow for relatively small device sizes. Minimum cell sizes are important to the design of very high density EPROMs, such as one megabit devices and larger. The area penalty caused by enclosure requirements can affect overall chip size, since the individual cell sizes are so small.

It would therefore be desirable to provide a cell layout and fabrication technique for high density EPROMs which is as small as possible. Such a fabrication technique preferably includes self-aligned structures whenever possible to minimize total cell area. It is also desirable for such a technique to be compatible with current process flows in standard use.

High density EPROM designs often include a buried Vss line. This line is formed as an active region within the substrate, so that conductivity is not as high as is the case for a metal line. As device sizes shrink, shrinking the width of the Vss line can lead to high resistivities which can adversely device performance.

It is therefore further desirable to provide a device layout and fabrication technique which provides a low resistivity Vss line. It is further desirable for such a technique to be consistent with the layout of small device sizes on a high density device, and to be compatible with current cell designs and fabrication techniques.

SUMMARY OF THE INVENTION

Therefore, according to the present invention, a layout and fabrication technique for EPROMs and similar devices includes a preferred technique for partially self-aligning bit line contacts. In addition, a self-aligned, buried Vss line is provided which is in contact with the substrate for its entire length. This provides a highly conductive Vss line, allowing the size of such line to be diminished. The use of a buried Vss contact line and a partially self-aligned bit line contact contributes to a device layout having minimum cell sizes for a given feature size.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 3–7 are cross-sectional views illustrating a preferred technique for forming EPROM cells according to a preferred embodiment of the present invention; and FIGS. 8–10 are plan views of a portion of an EPROM memory device constructed in accordance with the techniques described in connection with FIGS. 3–7.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
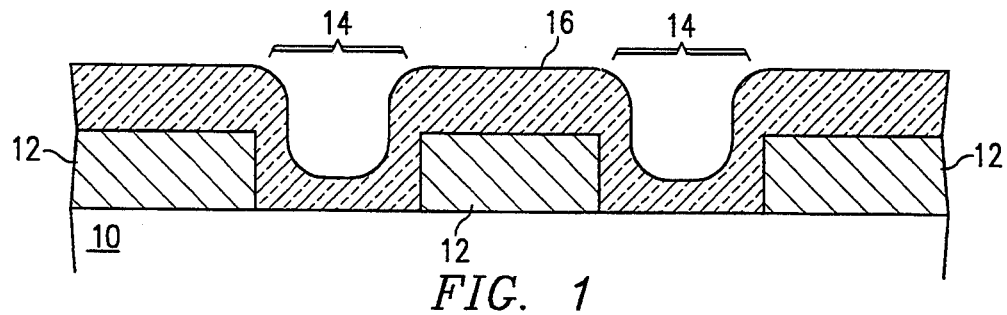
FIGS. 1 and 2 illustrate a technique for forming self-aligned contacts to an underlying layer in accordance with the present invention.
Figure 2:
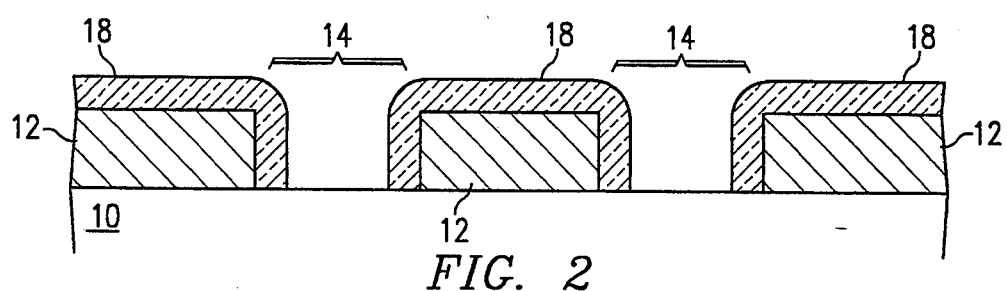

FIGS. 1 and 2 illustrate the use of a preferred technique for self-aligning contacts. As shown in FIGS. 1 and 2, the use is generic to any semiconductor integrated circuit device. FIGS. 3–10 will illustrate the use of the preferred technique to fabricate high density EPROMs.

Referring to FIG. 1, underlying structures on an integrated circuit device are referenced generally with the reference number 10. These structures can include a substrate, field oxide regions, and underlying layers of interconnect. For purposes of describing the present invention, the precise nature of the underlying structures 10 is not important.

On the underlying structure 10, several conductive structures 12 are formed. The conductive structures 12 may be, for example, polycrystalline silicon, or they may be polycrystalline silicon which has been silicided as known in the art. Between the conductive structure 12 are openings 14. Openings 14 are of a relatively small size. The precise size of openings 14 is somewhat dependent on process conditions as will be described below, but is typically less than approximately 1.2 microns.

According to the present invention, it is desirable to form contacts to the underlying structures 10 in both the openings 14. Contacts must be made with the underlying structures 10 while being insulated from the conductive structures 12.

A layer of oxide 16 is formed over the entire integrated circuit device. The layer 16 is formed in such a manner that it is thicker on top of the conductive structures 12 than along the sidewalls or bottom of the openings 14. Oxide can be deposited to such a differential thickness using Watkins-Johnson Model 998 deposition equipment. The oxide is deposited using chemical vapor deposition (CVD) techniques at approximately one atmosphere pressure. This results in a layer which, for opening dimensions less than approximately 1.2 microns, deposits less oxide on the sidewalls and bottoms of the openings 14. Typically, the width of the vertical portions of the layer 16, and the horizontal portion in the bottom of the openings 14, is approximately half of the depth of the layer 16 over the conductive regions 12.

Equipment such as the W-J 998 deposit oxide at a relatively fast rate at approximately standard atmospheric pressure. This results in deposition of a layer which has the properties described above, with the deposited oxide layer being thinner along the vertical sidewalls and the bottom of opening which are relatively small. It appears that the total volume of oxide deposited in the openings 14 is approximately the same as that which would have been deposited if a flat continuous surface existed between the conductive layers 12. Since this volume of material is spread over a larger surface, it forms a thinner layer along the sides and bottom of the openings 14.

Referring to FIG. 2, the oxide layer 16 is anisotropically etched without a mask to form the oxide regions 18 surrounding the conductive structures 12. The oxide layer 16 is cleared from the bottom of the openings 14, and remains on the sidewalls of the openings 14. Also, since the layer 16 was deeper over the conductive structures 12, a portion of the oxide regions 18 remains above each of the conductive structures 12. The thickness of the regions 18 be on both the conductive structures 12 is dependent upon the original thickness of the layer 16, and the time to which the device is subjected to an anisotropic etch. Complete removal of the regions 18 above the conductive structures 12 is prevented by the use of endpoint detection techniques as known in the art which detect when the layer 16 has been removed from the bottom of the openings 14.

Another conductive interconnect layer (not shown) can now be formed over the device. Contacts will be made through the openings 14 with the underlying region 10. With respect to the conductive structures 12, the contact openings have been self-aligned, so that no masking step is required to form them. This eliminates the requirement for the enclosure which is normally needed with each masking step, allowing the integrated circuit device to be made smaller.

Assuming that the conductive structures 12 project vertically out of the plane of the drawing of FIGS. 1 and 2, a next conductive layer will be only self-aligned in a left-to-right direction. A mask must still be used to define the openings in the direction perpendicular to the plane of the drawing. Thus, the described technique has resulted in a contact opening which has been aligned in a single direction, which is generally referred to herein as a semi-self-aligned contact. If the conductive structure 12 is patterned so as to define a square opening when seen from above, a contact opening which is fully self-aligned can be made since it will be separated from the surrounding structure by the conductive regions 18 on all sides. Thus, certain device designs will allow a fully self-aligned contact to be made.

The technique described above, using deposition of oxide to differential depths followed by an unmasked-anisotropic etchback, can be used in numerous different types of integrated circuit devices. It may be used, for example, in memory devices such as SRAMs, DRAMs, and EPROMs and EEPROMs. The technique may also be used in programmable logic devices of various types, and will be seen to be useful in many types of devices wherein regular arrays of closely spaced signal lines are required.

Figure 3:
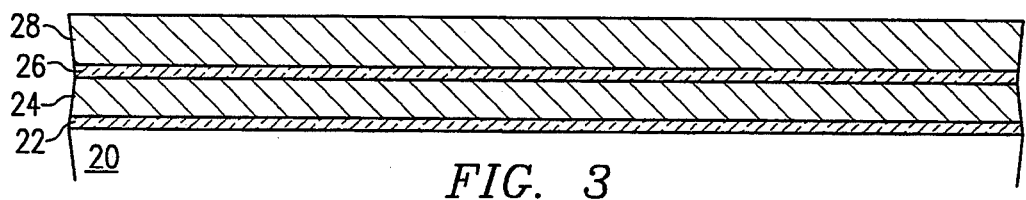

Referring to FIG. 3, an EPROM device is to be formed in a substrate 20. After formation of field oxide regions (not shown), a first gate oxide layer 22 is formed over the device, followed by a floating gate polycrystalline silicon layer 24. As known in the art, the floating gate 24 is then etched to form parallel signal lines in one direction. In the views of FIGS. 3-7, this direction is chosen to be left-to-right and parallel with the plane of the drawing of FIG. 3. Following the patterning of the floating gate polycrystalline silicon 24, a second gate oxide 26 is formed over the surface of the device, preferably using a thermal oxidation step. A second polycrystalline silicon layer 28 is then formed over the device. The polycrystalline silicon layer 28 is preferably silicided as known in the art to improve its conductivity.

Figure 4:
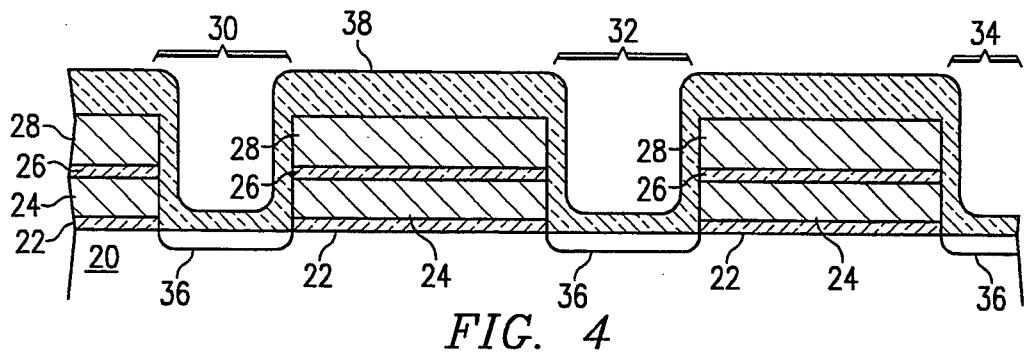

Referring to FIG. 4, both of the polycrystalline silicon layers 28 and 24, and their respective gate oxide layers 26 and 22, are etched using a single mask to form control lines having underlying floating gate regions. This second etch mask defines rows oriented at right angles to the first etch of the first polycrystalline silicon layer 24. This results in control lines 28 stretching the length of the memory array, with rectangular floating gate regions 24 under portions of each of the control lines 28. As shown in FIG. 4, the second etching step forms control lines 28 which extend perpendicular to the plane of the drawing of FIG. 4. Processing to this point has been conventional.

After the control gates 28 have been patterned, a lightly doped drain (LDD) implant is made over the device to form LDD regions 36 within the openings 30, 32, 34, a layer of oxide 38 is then deposited over the surface of the device. This layer is deposited using the technique described in connection with FIGS. 1 and 2, so that the thickness of layer 38 over the control gates 28 is approximately twice that of those portions residing in the bottom of the openings 30, 32, 34.

Figure 5:
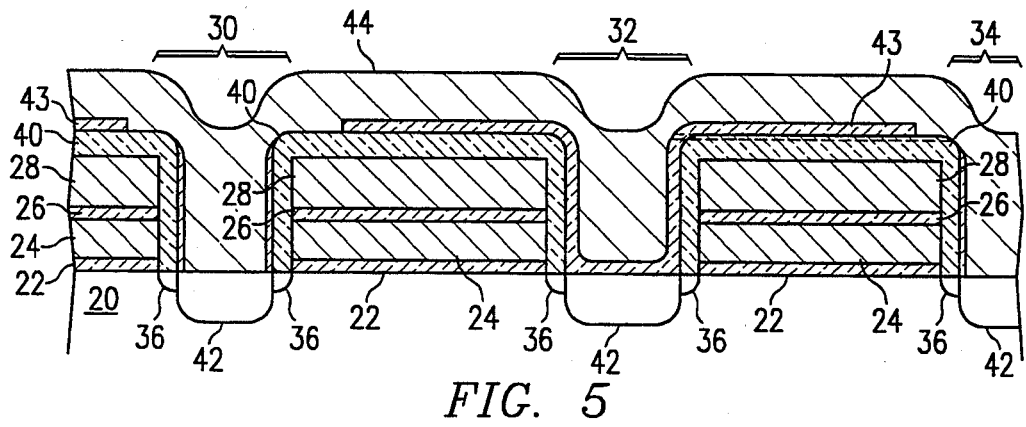

Referring to FIG. 5, oxide layer 38 is anisotropically etched back without a mask, to form oxide regions 40 surrounding the control gates 28 and floating gates 24. As described previously, the oxide regions 40 remain over the control gates 28 because they were thicker to begin with over such layers. Preferably, the periphery regions of the device are masked during the anisotropic etching step, so that only the memory array is subject to such etch. The described technique is less useful in the periphery where closely spaced, regular signal lines are not as common as they are in the array.

After formation of the oxide regions 40, a blanket implant is made to form heavily doped regions 42. A thin oxide layer 43 is formed over the device, and patterned and etched to expose the openings 30 and 34. Thin sidewall regions will remain in the openings 30 and 34. The layer 43 is preferably approximately 800 angstroms thick, and is used to protect the substrate in opening 32 during the following polycrystalline silicon etch step. A layer of polycrystalline silicon 44 is next formed over the device, and preferably silicided as known in the art.

Referring to FIG. 6, the polycrystalline silicon layer 44 is patterned to define Vss signal lines 46. The Vss signal lines are formed in alternate rows within the device, being shown located in openings 30 and 34. In between each pair of Vss lines 46, an opening 32 remains which will later be used for a bit line contact. The Vss lines extend perpendicular to the plane of the drawing of FIG. 6 to the edges of the periphery, and so alignment is only critical in the left to right direction as shown in FIG. 6. In this direction, the Vss signal lines are self-aligned because of earlier formation of oxide regions 40. Thus, the mask used to pattern the Vss lines 46 is non-critical, and a certain amount of overlap over adjacent control gates 28 is not harmful. In fact, overlap can be considered beneficial because the resistance of the Vss line 46 is lowered if it has a greater overlap over the adjacent control gates 28, due to the greater cross-sectional area of the lines.

After the Vss lines 46 have been patterned, a short oxide etch is performed to clear remaining portions of the oxide layer 43 from the device. Remnants of the layer 43 are left under portions of the polycrystalline silicon regions 46. Any portions of the oxide regions 40 which may be removed present no problem, since another oxide layer will be deposited immediately after the clearing etch.

Another layer of oxide 48 is then deposited over the device using the technique described in connection with FIGS. 1 and 2. This results in a depth over most of the device which is twice that of the oxide depth in the bottom of opening 32. The device is then anisotropically etched using a mask to clear the oxide layer 48 from the bottom of opening 32. The size and positioning of the mask is not critical, since the opening 32 is self aligned in one direction, and is adjacent to field oxide regions in the other as will be described in connection with FIG. 10. As described above, it is preferable to also mask the periphery circuitry during this anisotropic etching step.

Referring to FIG. 7, oxide regions 50 remain after the anisotropic etch step just described. This oxide 50 serves to separate the Vss lines 46 from the next conductive layer 52, which is a polycrystalline silicon layer deposited to form bit lines for the array. Polycrystalline silicon layer 52 is preferably doped and silicided as known in the art to improve its conductivity. If desired, bit line 50 can be formed from a metal, or metal alloy, such as aluminum. The bit line 52 is then patterned and etched as known in the art, and further processing on the device is conventional from this point.

Figure 9:
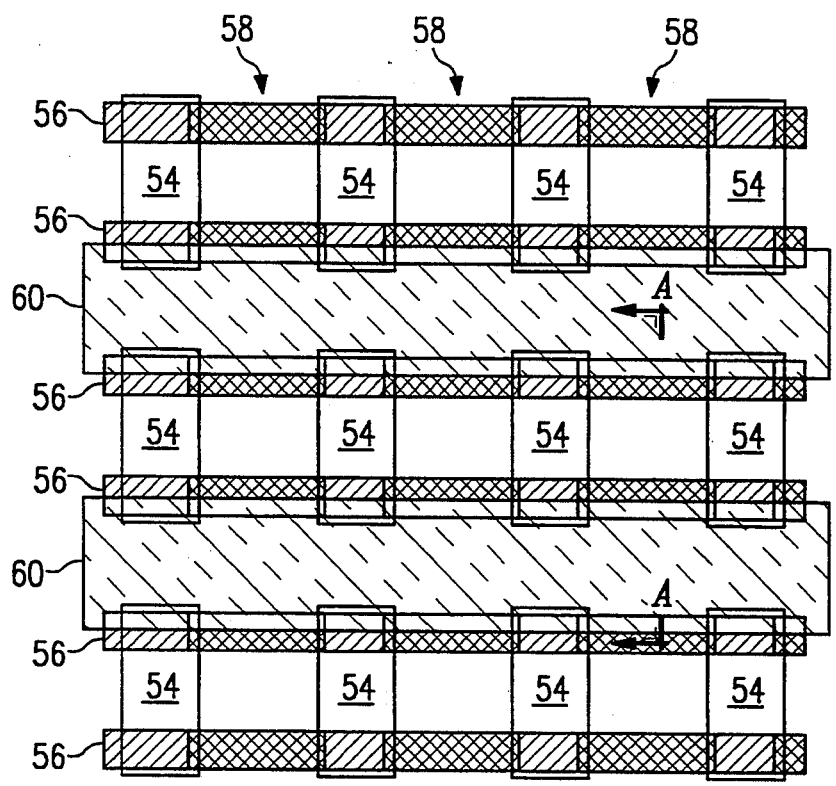
Figure 10:
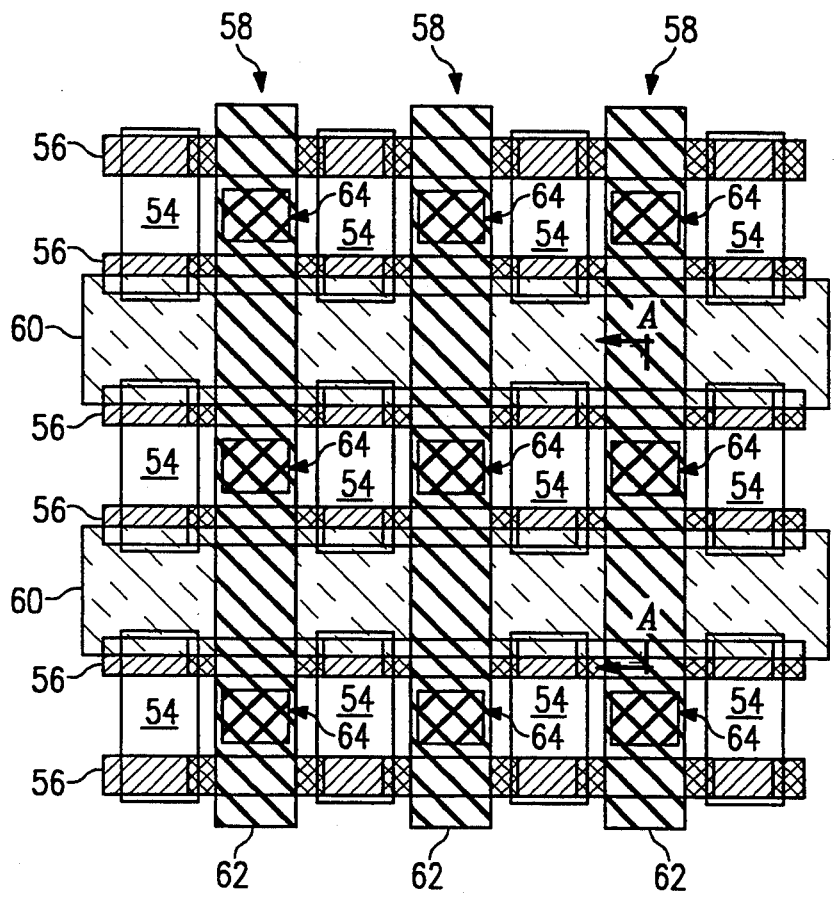

FIGS. 8–10 show a plan view of portion of an EPROM device constructed according to the techniques described in FIGS. 3–7. In each of FIGS. 8–10, the section line A—A shows the direction and location of the cross-sectional views of FIGS. 3–7.

Referring to FIG. 8, field oxide regions 54 are initially formed on the substrate as shown. Control gates 56 are located as shown. Between each pair of adjacent field oxide regions 54, columns 58 indicate the locations of the floating gates. The floating gates are formed and located using techniques already known in the art.

Referring to FIG. 9, the Vss lines 60 are formed as shown. They extend over the adjacent control gates 56, and make contact to the underlying substrate throughout their length. Since the Vss lines 60 are preferably silicided, they are relatively highly conductive. This allows the width of the Vss line 60 to be minimized while still retaining the required conductivity for proper device operation. Since the Vss lines continue to extend to the left and right as shown in FIG. 9, the only alignment direction which is critical is up and down as shown in FIG. 9. As described above, the Vss lines are completely self-aligned in such direction, so that the elongated Vss lines can be considered to be completely self-aligned.

Referring to FIG. 10, bit lines 62 have been formed and patterned as described in FIG. 7. Bit line contacts 64 are formed in place as shown, making contact to underlying heavily doped regions of the substrate. Since bit line contacts 64 are surrounded on the left and right by field oxide regions 54, alignment to the left and right is not critical. In the critical alignment direction, along the bit line 62, the contacts 64 are self-aligned as described above. Thus, alignment of the bit line contact 64 is not critical, and no unnecessary enclosure need be added which enlarges the size of the EPROM memory cells.

Each of the bit line contacts 64 are surrounded on two sides by the control gates 56, allowing them to be self-aligned along the direction of the bit line 62. In the orthogonal direction, each bit line contact 64 is located adjacent to a field oxide region 54. Although the preferred process described above does not require it, it is possible to form the field oxide regions 54 with a relatively steep step at their edges. This provides a steep enough feature to allow for self-alignment to occur in the left to right direction at FIG. 10. If the field oxide regions are formed in this manner, the bit line contacts 64 are actually fully self-aligned. With this modification, both the Vss lines 60 and the bit line contacts 64 are fully self-aligned. This means that enclosure requirements for the overall device have been minimized, since no enclosure is required for either the Vss line 60 or the bit lines 64.

The silicided Vss lines 60 contact the substrate for their entire length. These are buried Vss lines which are an improvement over the use of active areas of the substrate for the Vss lines. In prior designs, using only the active area of the substrate for the Vss line, a metal or silicided polycrystalline silicon line must be strapped to the substrate at intervals to keep the overall resistance of the Vss line from becoming too high. With the described structure and fabrication technique, the Vss line in the substrate is strapped to a silicided Vss line along its entire length, thereby significantly improving the conductance of the line. As a result, it is not necessary to strap the Vss line in the substrate as is done using prior art techniques.

Formation of the EPROM as described above utilized a preferred technique for applying an oxide layer having differential thickness in order to leave a remaining oxide layer on top of conductive structures while removing it from the bottom of the via. If desired, typical previous techniques can be used in which an oxide layer is formed over each of the polycrystalline silicon layers prior to patterning them. This would be followed by deposition of another oxide layer followed by an anisotropic etchback to form sidewall regions alongside the conductive structures. This prior art technique could be used to form a structure similar to that shown in FIGS. 7 and 10, but without the requirement for using the differential oxide thickness deposition described in connection with FIGS. 1 and 2. The described technique is preferred, however, because use of previous techniques as just described involves patterning and etching a combined polycrystalline silicon and oxide layer, which is more difficult than etching a single polycrystalline silicon layer, especially at very small feature sizes.

It will be appreciated by those skilled in the art that the described invention can be utilized with devices other than EPROMs. For example, EEPROMs have a structure which is nearly identical to that which has been described, and the described techniques can be used in EEPROMs also. Some ROM designs are also very similar to the described layout, and can take advantage of the described techniques. Similar devices which utilize similar designs can be fabricated so as to take advantage of the described method.

While the invention has been particularly shown and described with reference to a preferred embodiment, it will be understood by those skilled in the art that various changes in form and detail may be made therein without departing from the spirit and scope of the invention.

What is claimed is:

1. A method for forming signal lines for a nonvolatile integrated circuit memory device, comprising the steps of:
   forming a plurality of parallel control gates over a substrate, the control gates each having a top and sidewalls, wherein a continuous substrate region remains between alternate pairs of control gates;
   forming an insulating layer on the control gate tops and sidewalls;
   introducing impurities into the substrate between the control gates to form active regions; and
   between the control gate pairs having a continuous substrate region, forming conductive signal lines in continuous contact with the substrate;
   forming a second insulating layer over the entire device;
   forming openings through the second insulating layer to active substrate regions between control gate pairs which do not have conductive signal lines between them; and
   forming bit lines in a direction orthogonal to the control gates and making contact to the substrate through the openings in the second insulating layer.

2. The method of claim 1, wherein said second insulator forming step comprises the steps of:
   forming the second insulating layer over the device, wherein the second insulating layer has a first thickness over horizontal surfaces and a second thickness in spaces between the control gates which is lesser than the first thickness; and
   anisotropically etching the second insulating layer to remove it from horizontal surfaces having the second thickness and leaving material behind in areas having the first thickness.

3. A method for forming signal lines for a nonvolatile integrated circuit memory device, comprising the steps of:
   forming a plurality of parallel control gates over a substrate, the control gates each having a top and sidewalls, wherein a continuous substrate region remains between alternate pairs of control gates;
   forming an insulating layer over the device, wherein the insulating layer has a first thickness over the control gates and a second thickness in spaces between the control gates which is lesser than the first thickness; and
   anisotropically etching the insulating layer to expose the substrate between the control gates, leaving an insulating layer on the tops and sidewalls of the control gates;
   introducing impurities into the substrate between the control gates to form active regions; and
   between each control gate pair having a continuous substrate region, forming a single conductive signal line in continuous contact with the substrate.

4. The method of claim 3, wherein the insulating layer comprises oxide which is deposited at a constant depth/unit area, except in the spaces between the control gates wherein the volume of deposited oxide is the same as would be deposited over a control gate area having the same size as the spaces.

5. The method of claim 4, wherein the oxide is deposited at atmospheric pressure and at a high deposition rate.

6. The method of claim 5, wherein the second thickness is one-half the first thickness.

* * * * *

UNITED STATES PATENT AND TRADEMARK OFFICE
CERTIFICATE OF CORRECTION

PATENT NO. : 5,376,571
APPLICATION NO. : 08/118843
DATED : December 27, 1994
INVENTOR(S) : Bryant et al.

It is certified that error appears in the above-identified patent and that said Letters Patent is hereby corrected as shown below:

Column 7
Line 52, "having a continuous substrate region" should read as --having the continuous substrate region--

Column 8
Lines 35-36, "leaving an insulating layer" should read as --leaving the insulating layer--

Lines 40-41, "having a continuous substrate" should read as --having the continuous substrate--

Signed and Sealed this

Seventeenth Day of November, 2009

David J. Kappos
*Director of the United States Patent and Trademark Office*